United States Patent
Tarbouriech

[19]

[11] Patent Number: 6,144,611
[45] Date of Patent: Nov. 7, 2000

[54] METHOD FOR CLEARING MEMORY CONTENTS AND MEMORY ARRAY CAPABLE OF PERFORMING THE SAME

[75] Inventor: Jean-Claude Tarbouriech, Ville-la-Grand, France

[73] Assignee: Motorola Inc., Schaumburg, Ill.

[21] Appl. No.: 09/391,904

[22] Filed: Sep. 7, 1999

[51] Int. Cl.[7] .................................................. G11C 8/00
[52] U.S. Cl. ...................... 365/230.06; 365/154; 365/156
[58] Field of Search ................................ 365/218, 230.06, 365/230.08, 154, 156; 326/119, 121

[56] References Cited

U.S. PATENT DOCUMENTS

| | | | |
|---|---|---|---|
| 4,412,309 | 10/1983 | Kuo | 365/184 |
| 5,394,373 | 2/1995 | Kawamoto | 365/230.06 |
| 5,907,505 | 5/1999 | Tomita | 365/185.18 |
| 5,949,735 | 9/1999 | Jeong | 365/230.06 |

*Primary Examiner*—David Nelms
*Assistant Examiner*—Gene N. Auduong
*Attorney, Agent, or Firm*—Patricia S. Goddard

[57] ABSTRACT

The present invention provides a means for clearing or wiping the contents of a RAM array without the need for overly large transistors and without experiencing current spikes by using a progressive row-by-row clearing operation. In reference to FIGS. 4 and 5, progressive row clearing is achieved by the addition of a transistor (72) in series with the row RAMWIPE transistor (e.g. transistor 69) in each row. Transistor 72 is gated by a signal PRS (Previous Row Select). PRS for a given row will be asserted or enabled only when the previous row in the array is also selected or enabled. A given row is only selected for clearing in a wipe operation when both a RAMWIPE signal and a PRS (previous row select) signal are asserted. The next row, therefore, is not cleared until the previous row is cleared.

9 Claims, 2 Drawing Sheets

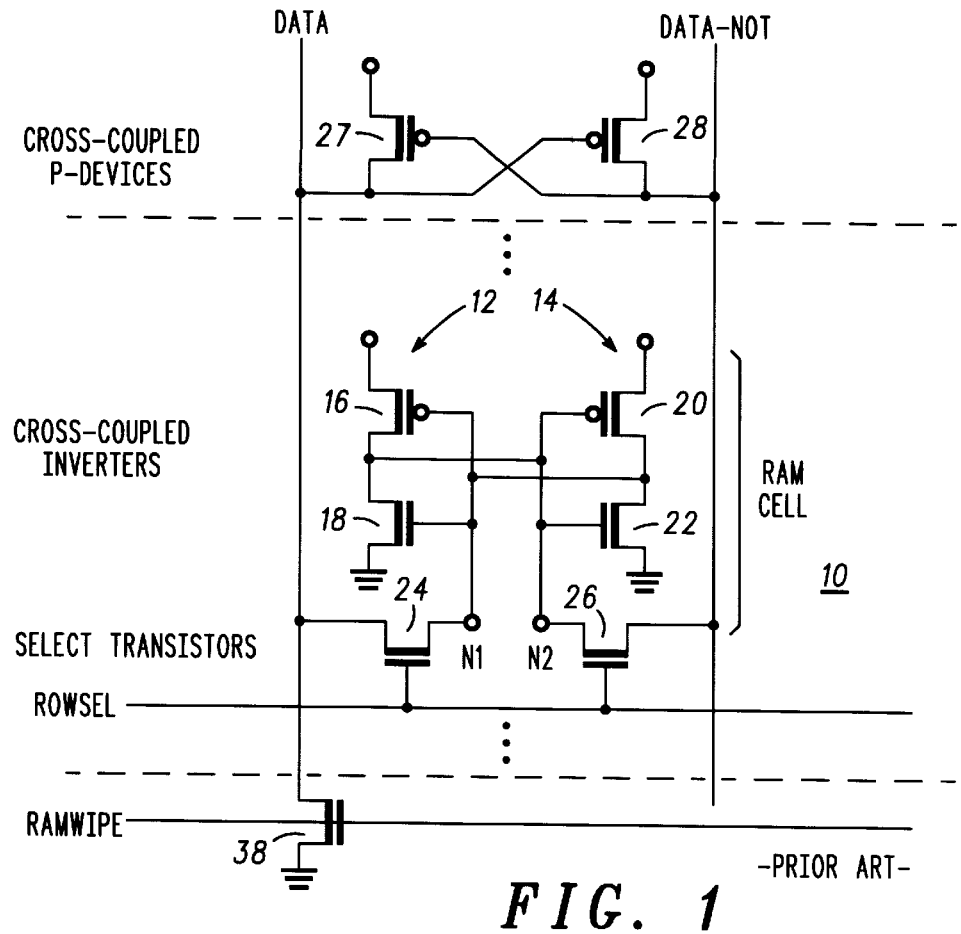
FIG. 1 -PRIOR ART-
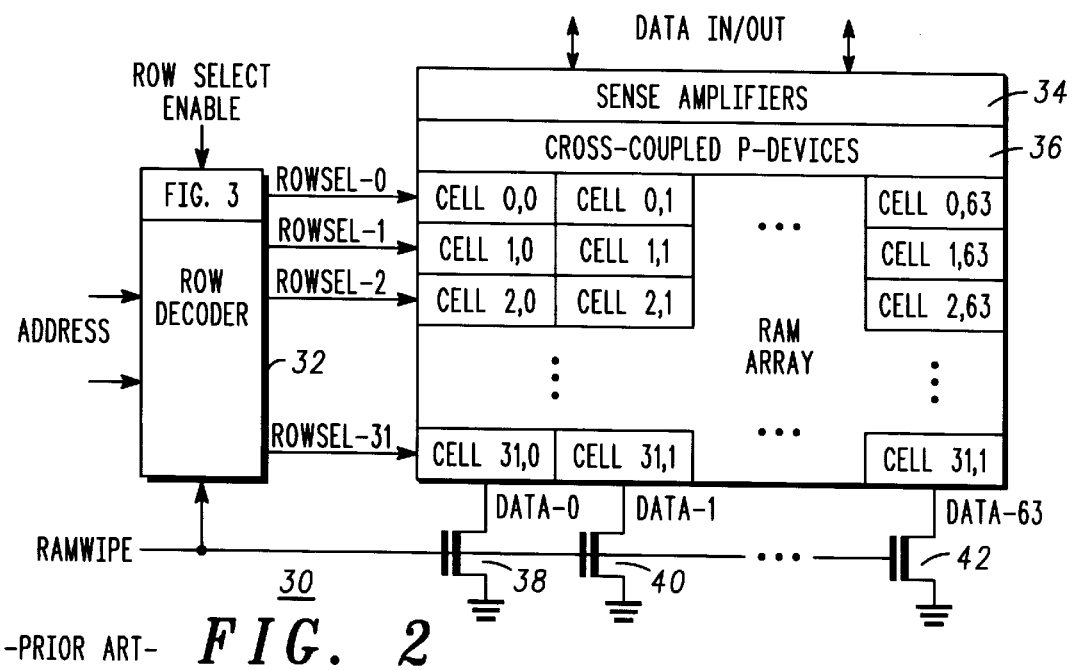
-PRIOR ART- FIG. 2

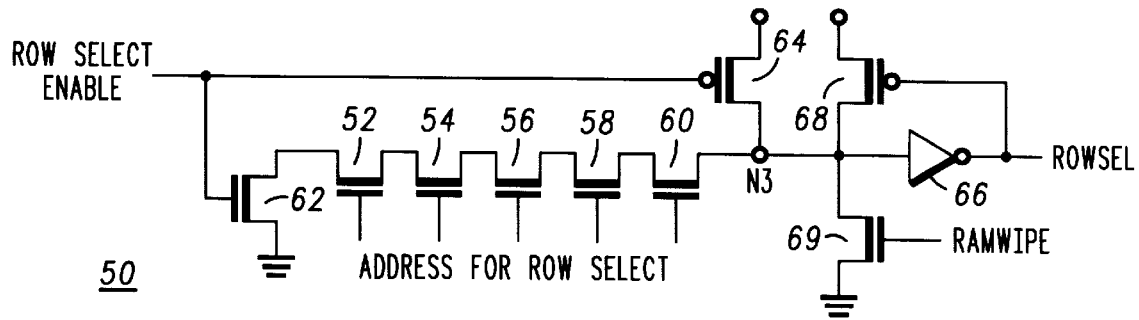
FIG. 3 -PRIOR ART-
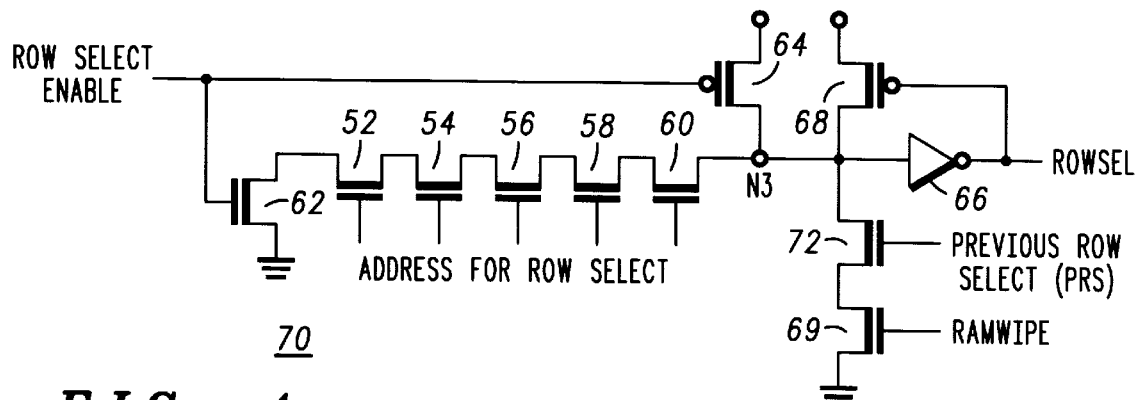
FIG. 4
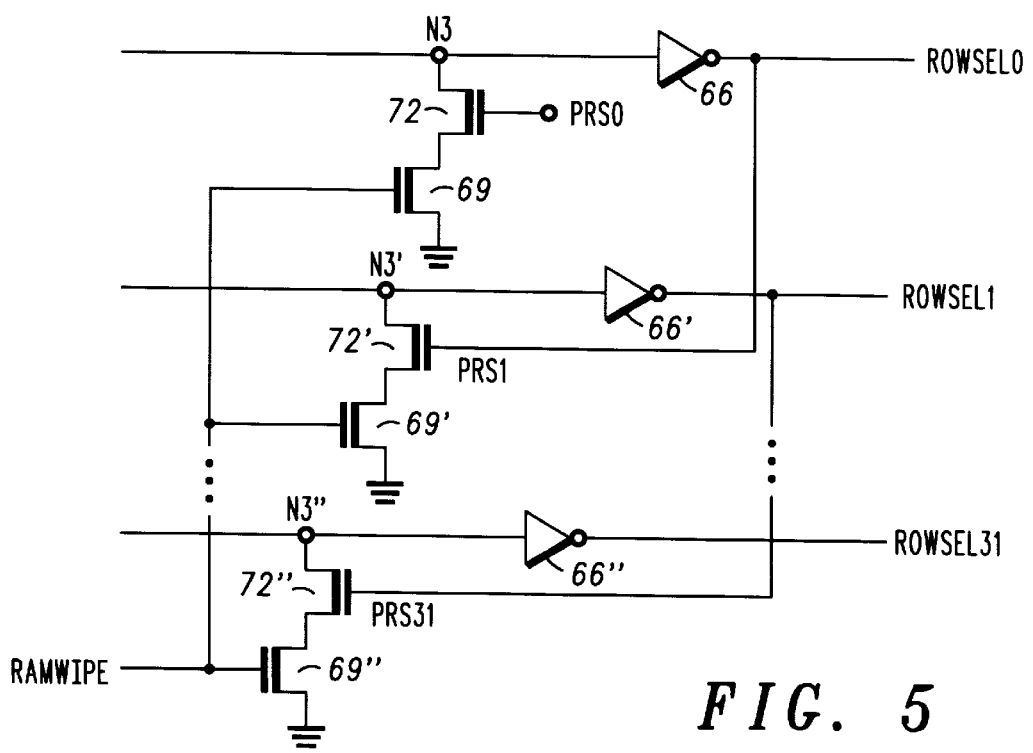
FIG. 5

METHOD FOR CLEARING MEMORY CONTENTS AND MEMORY ARRAY CAPABLE OF PERFORMING THE SAME

FIELD OF THE INVENTION

The present invention relates to integrated circuit memories in general, and more specifically to a method for clearing the contents of a random access memory (RAM).

BACKGROUND OF THE INVENTION

Random Access Memories (RAM) are memories which temporarily store data in a memory array for use by other parts of an integrated circuit (IC), e.g. a microcontroller or microprocessor unit (MPU). In many ICs, the RAM is controlled by the MPU. For example, in an MPU-based IC used in smart card applications, the MPU controls the RAM to prevent misuse of data stored. If the MPU detects an abnormal condition (e.g., a frequency, temperature, or voltage which is too high or too low), the MPU forces the IC into a full reset to prevent a hacker from gaining access to the sensitive data stored in the chip. Upon forcing a reset, the entire contents of the RAM must be cleared or wiped in case some of the sensitive data was stored in RAM when the abnormal condition was detected.

FIG. 1 illustrates a typical RAM cell 10, while FIG. 2 shows a typical 256 byte (2048 bit) RAM array 30 organized in thirty-two rows by sixty-four columns. One known method for clearing the contents of the illustrated RAM array will be discussed in conjunction with these two figures. Cell 10 includes two cross-coupled inverters 12 and 14. Inverter 12 includes a P-MOS transistor 16 and an N-MOS transistor 18, while inverter 14 includes a P-MOS transistor 20 and an N-MOS transistor 22. Cell 10 also includes two select transistors (N-MOS transistors) 24 and 26 which are used to select the particular row of the array to be written to in a write operation or to be cleared when the row is to be cleared or wiped. Within array 30, there is a cell, like cell 10, for each bit of the array. Additionally, within the array are row decoders 32, sense amplifiers 34, cross-coupled P-MOS devices 36 (one pair for each column of the array, and shown as P-MOS transistors 27 and 28 of FIG. 1), and N-MOS RAMWIPE transistors 38–42 (again, one for each column of the array). All P-devices shown in FIGS. 1 and 2 (namely transistors 16, 20, 27, and 28) are resistive devices, meaning that their "on" resistivity is much higher than that of N-MOS transistors 24, 26, and 38–42. The resistive devices could even be replaced by high value resistors with the same effect.

To wipe the contents of the RAM array, a zero is written to each cell of the array by forcing a "0" on Node 1 (N1) which in turn will eventually bring a "1" at node 2 (N2). This is accomplished by forcing the array's "RAMWIPE" line high, which in turns forces each "DATA" line (column) low when "ROWSEL" goes high to force N1 low. In other words, the classical way to erase the array contents is to select all rows of the array at once, and force a "0" into all array cells at the same time. To achieve this, each of RAMWIPE transistors 38–42 must be sized so that each can overpower all thirty two of the column's cross-coupled inverters (e.g. overpower transistor 20 of inverter 14 of the cell in FIG. 1) and the column's cross coupled P-devices (e.g. by overpowering transistor 27 of the cell of FIG. 1). Such a transistor corresponds in size to a transistor thirty times bigger than the N-MOS transistors used to write a "0" or a "1" in RAM during a normal RAM write operation.

FIG. 3 illustrates a typical row decoder circuit 50 of row decoder 32 in more detail. Circuit 50 is used to select a row of the memory array, and is replicated for each row of the array. Circuit 50 includes a plurality of transistors 52–60 for providing an address select value of the array and an N-MOS transistor 62 coupled to the plurality of transistors 52–60 and to a Row-Select-Enable signal. Only when the correct value is present on transistors 52–60 will the Row-Select-Enable Signal go high (i.e. become enabled). Circuit 50 also includes a P-MOS transistor 64 coupled to the Row-Select-Enable signal and to the plurality of transistors 52–60 at a Node 3 (N3), an inverter 66 having N3 as an input and a ROWSEL (for Row Select) signal as an output, a P-MOS transistor 68 also coupled to N3 and gated by ROWSEL, and an N-MOS transistor 69 coupled to the input of inverter 66 and being gated by the RAMWIPE signal. When Row-Select Enable is high, transistor 64 is in its "off" state and N3 is pulled low, resulting in ROWSEL being asserted (as a result of inverter 66). When Row-Select Enable is low, transistor 64 is in its "on" state and N3 is pulled high, resulting in ROWSEL being negated. Transistor 68 is included to stabilize the value at N3, high or low, or in other words to prevent leakage which might otherwise affect assertion of ROWSEL. Transistor 69 is used to select the row to be cleared upon assertion of the RAMWIPE signal. In comparison, transistors 38–42 (shown in FIG. 2) are used to select their respective columns during assertion of the same signal.

A row is selected when N3 is pulled low (a logic level "0"), and thus ROWSEL goes high (is a logic level "1") due to inverter 66. In a normal read/write operation of the array, N3 is pulled low when the Row-Select Enable signal is high and the appropriate address value is present on the plurality of transistors 52–60. Different combinations of address values are used so that only one row is selected at a time during a normal read/write operation. But when one is clearing or wiping the entire RAM array, all rows of the array are selected at the same time by asserting the RAMWIPE signal such that N3 is pulled low for each row simultaneously. When RAMWIPE is asserted the address value at transistors 52–60 is ignored.

Again, the most significant disadvantage of the prior art circuitry described above for clearing or wiping the contents of a RAM array is the size of transistors 38–42 needed to adequately select all rows of the array at the same time. As with all integrated circuits, a primary goal is to minimize the size of the final die. Another disadvantage is that in order for transistors 38–42 to overpower the cross-coupled inverters in each cell of their respective columns and the cross-coupled P-devices at the top of the column, there is a very large current surge during a clear operation which can adversely affect other parts of the integrated circuit. Thus, there is a need for an improved circuit for clearing or wiping the contents of a RAM array which occupies a minimum amount of silicon die area and draws a much smaller amount of current during a clearing operation.

BRIEF DESCRIPTION OF THE DRAWINGS

FIG. 1 is a circuit diagram of a RAM cell in accordance with the prior art.

FIG. 2 is a block diagram of a RAM array incorporating the cell of FIG. 1 for each bit in accordance with the prior art.

FIG. 3 is a circuit diagram of row decode circuitry used for each row of the RAM array of FIG. 2, and also in accordance with the prior art.

FIG. 4 is a circuit diagram of row decode circuitry suitable for wiping or clearing contents of a RAM array in accordance with the present invention.

FIG. 5 is a circuit diagram showing a series of rows including the row decode circuitry of FIG. 4 and also in accordance with the present invention.

DETAILED DESCRIPTION OF A PREFERRED EMBODIMENT

The present invention provides a means for clearing or wiping the contents of a RAM array without the need for overly large transistors and without experiencing current spikes by using a progressive row-by-row clearing operation. Progressive row clearing is achieved by the addition of a transistor in series with the row RAMWIPE transistor (e.g. transistor 69) and which is gated by ROWSEL of the previous row. Accordingly, N3 of a row can only be pulled low (and thus ROWSEL of a row can only be enabled) once the previous row has been selected or enabled. These and other features, and advantages, of the invention will be more clearly understood from the following detailed description taken in conjunction with the accompanying FIGS. 4–5.

FIG. 4 illustrates, in circuit diagram form, a row decode circuit 70 suitable for wiping or clearing contents of a RAM array in accordance with the present invention. It is noted that in FIG. 4, many of the same reference numerals as in FIG. 3 are used because these designate identical or corresponding parts in the figures. As shown in FIG. 4, an additional transistor 72 is added which is connected in series with transistor 69. While transistor 69 is gated by RAMWIPE, transistor 72 is gated by a signal PRS (Previous Row Select). In the prior art circuit of FIG. 3, when the RAMWIPE signal was asserted, N3 was pulled low and the row was selected regardless of the address value supplied, and all rows were selected simultaneously. With the present invention, N3 is not pulled low unless both RAMWIPE and PRS are asserted. Thus, a row is not selected or enabled to be cleared until the previous row has been selected. However, it is noted that the term "previous row" need not refer to a row which is physically previous or previous in location. However, to minimize signal routing, it is advantageous for a "previous row" to be adjacent, in either direction, to the current row.

The manner in which the previous row selection is used to control the clearing of the current row is illustrated in more detail in the circuit diagram of FIG. 5. FIG. 5 illustrates the relevant decode circuitry for Row0, Row1, and Row31 of a thirty-two row RAM array. Row2–Row30 are not illustrated to avoid redundancy since these rows would be connected and operate in the same manner as the rows shown. Row0, the first row in the array, is shown with its associated N3, transistors 69 and 72, inverter 66 and ROWSEL (in this case called ROWSEL0) signal as already described in reference to FIG. 4. Since Row0 is the first row in the array, there is no previous row which is required to be enabled before N3 is pulled low by asserting the RAMWIPE signal, causing ROWSEL0 to be enabled. Accordingly, PRS0 is connected to Vdd (the main power supply to the array and chip), and ROWSEL0 will be enabled immediately upon asserting RAMWIPE. It is noted that PRS0 and transistor 72 are not really needed in Row0, but from a design perspective it may be desirable to include these since then the same circuitry can be readily duplicated and repeated for each row of the array.

The relevant portion of the decode circuitry associated with Row1 of the array is illustrated in FIG. 5 using many of the same reference numerals as used in Row0, except a prime (') is added to denote that they are actually different elements or devices, albeit functionally the same as those in Row0. Similarly, these elements are shown in relation to Row31 with a double prime ("). Row2–Row30 will have these same elements as well but are not shown to avoid unnecessary repetition.

A difference between Row1 of the array and Row0 is that transistor 72' is gated by PRS1 rather than being tied to Vdd. PRS1 is connected to ROWSEL0 so that when ROWSEL0 is high or asserted, PRS1 is high or asserted and when ROWSEL0 is low or negated, PRS1 is low or negated. Accordingly, transistor 72' is only turned on if the previous row (in this case Row0) has been selected (i.e. ROWSEL0 has been asserted). If transistor 72' is in its "off" state, the assertion of RAMWIPE will not cause Row1 to be selected since selection of Row1 is dependent on both transistor 69' and transistor 72' being in their "on" state.

Each row following Row1 will operate analogously. For example, a transistor corresponding to transistor 72' will be gated by PRS2 which is connected to ROWSEL1. Only when ROWSEL1 is high or asserted will Row2 be selected. These continues for all rows in the array, through Row31 as shown for a thirty-two row array.

Naturally, because the rows are selected and cleared in a progressive row-by-row manner, there is a difference in the time it takes to clear the entire RAM array contents using the present invention as compared to the prior art technique described previously. The delay can be determined as follows. From the time N3 is pulled low, there is a delay (call it $t_r$) until ROWSEL of that row actually reaches its high or asserted state. This is due to high capacitive loading of the row select lines in the RAM array since each line is driving the gates of one hundred and twenty eight select transistors, assuming a sixty four column array and two select transistors per column (see FIG. 1). If $t_0$ is the time when RAMWIPE goes high or is asserted, then ROWSEL0 will go high or be asserted at time $t_0+t_r$ and ROWSEL1 will go high or be asserted at time $t_0+2t_r$, . . . and ROWSEL31 will go high or be asserted at time $t_0+32t_r$. If this time delay is too great for a particular application, the array can be divided into halves or even quarters so that propogation of the clear occurs two or fours rows at a time. For instance, the PRS signal of Row0 and Row15 could both be tied to Vdd so that upon assertion of RAMWIPE, Row0 and Row15 are cleared, followed by Row1 and Row16, etc. This would reduce the total delay of clearing the array by a factor of two. The time delay for clearing the entire array can also be reduced if an application can withstand a higher current surge than experienced during a normal read/write operation as further explained below.

Propagation of the clearing or wiping operation in accordance with the invention prevents a current spike and reduces the size of the RAMWIPE transistors because of the following. During the period between $t_0+t_r$ and $t_0+2t_r$, Row0 is the only row selected and transistor 38 associated with Column0 (see FIGS. 1–2) only needs to overpower two P-devices, namely one cross-coupled P-device at the top of the column (27) and one P-device (20) of inverter 14, to bring N1 low in the cell corresponding to Row0, Column0. "Overpowering" as used here refers to bringing N1 of the cell of interest low, which is not necessarily the same as bringing N2 high. It will take some time of N2 (and thus Data-Not) to go high after N1 is brought low. Transistor 40 does the same as transistor 38 for the cell at Row0, Column1. Transistor 42 does the same for the cell at Row0, Column31. Analogous transistors do the same for the cells of Row0 in Columns 2–30.

During the period between $t_0+2t_r$ and $t_0+3t_r$, Row0 and Row1 are the only rows selected, but because N1 in the cells in Row0 are already low, transistor 38 again only has to overpower two P-devices, namely transistor 20 of inverter 14 in the cell located at Row1, Column0 and the cross-coupled P-device 27 at the top of the column to bring N1 low. This task is made easier since the previous cell in the column has already been cleared. For each additional time period $t_r$, transistor 38 only has to overpower two P-devices, transistors 20 and 27. It is aided in this task by all the P-devices of the RAM cells of previous rows which have already been cleared, and which help move N2 and the Data-Not line high, which in turn is going to switch off cross-coupled P-device 27.

Accordingly, the size of each of the column RAMWIPE transistors 38–42 can be reduced drastically as compared to corresponding transistors in the prior art circuit described previously. As an example, for a 256 byte array (arranged in 32 rows and 64 columns) using the invention, these transistors are thirty times smaller, which far offsets the slight increase in silicon area due to the addition of a transistor 72 and its corresponding gate connection for each row in the row decode circuitry. A current spike during a RAM wipe or clear operation is also eliminated because the same amount of current is drawn during a wipe operation as during a normal read/write operation. Elimination of the current spike is particularly important in wireless applications, such as contactless smartcards, where power is supplied by an RF frequency. In these applications, a surge in supply current will collapse the supply voltage of the chip and prevent it from operating. A disadvantage is that duration of a wipe operation is longer ($n \cdot t_r$ where n is the number of rows and $t_r$ is the time required to select a row). However, the delay can be quite small. For instance, in the 256K byte array described above $t_r$ is equal to only ten nanoseconds (10 nsec). However, if the delay is too great for any particular application, one way to reduce the delay is to segment or partition the array as explained above. Another is to increase the size of transistors 38–42 and to clear more than one row at a time if the particular application can withstand the corresponding current surge needed to overpower more devices.

Thus it is apparent that there has been provided, in accordance with the invention, a method for clearing the contents of a RAM and circuit for performing the same that fully meets the need and advantages set forth previously. Although the invention has been described and illustrated with reference to specific embodiments thereof, it is not intended that the invention be limited to these illustrative embodiments. Those skilled in the art will recognize that modifications and variations can be made without departing from the intended scope of the invention. For example, one skilled in the art will recognize that the invention can be implemented using devices of opposite conductivity as compared to those illustrated and described. In such case, the circuit would be designed to negate rather than assert certain signals, and vice versa, with the same net result. In addition, the invention is not limited to any particular size of RAM array. A 256 byte array was used as an example only. Nor is the invention limited to use in progressively selecting rows, but can instead be used to progressively select columns. In addition, the invention is not limited to clearing or erasing the entire array but can be used to clear a selected portion of the array. Furthermore, the invention can be used to set the entire array (or portion thereof) to any value ("0" or "1"), not just clearing it. Moreover the invention is not limited to use with conventional RAM arrays. For instance, the invention could be used with register banks which are implemented using RAM cells. Therefore it is intended that this invention encompass all such variations and modifications as fall within the scope of the appended claims.

What is claimed is:

1. A method for clearing the contents of a memory array having a plurality of rows and row decode circuitry associated with each row, the method comprising the steps of:

selecting a first row to be cleared by asserting a memory clear signal, wherein upon selection of the first row, the row decode circuitry associated with the first row asserts a first row select signal;

selecting a second row to be cleared by asserting both the memory clear signal and the first row select signal, wherein upon selection of the second row, the row decode circuitry associated with the second row asserts a second row select signal; and progressively selecting remaining rows of the plurality of rows to be cleared by asserting both the memory clear signal and a row select signal associated with a previously selected row, wherein upon selection of each remaining row, the row decode circuitry associated with said each remaining row asserts a row select signal associated with said each remaining row for use in selecting a next remaining row.

2. The method of claim 1 wherein the memory array is a random access memory array (RAM).

3. The method of claim 1 wherein the row decode circuitry associated with each of the second and remaining rows of the plurality of rows comprises:

a memory clear transistor which is in its "on" state upon assertion of the memory clear signal; and a previous row select transistor which is in its "on" state upon assertion of the row select signal associated with a previous row.

4. The method of claim 3 wherein the row decode circuitry associated with the first row comprises:

a memory clear transistor which is in its "on" state upon assertion of the memory clear signal; and a previous row select transistor which is in its "on" state whenever power (Vdd) is being supplied to the memory array.

5. A memory array comprising:

a plurality of rows;

row decode circuitry associated with each row of the plurality of rows for selecting its associated row by asserting a row select signal, said row decode circuitry comprising:

a memory clear transistor which is in an "on" state in response to assertion of a memory clear signal;

a previous row select transistor connected in series with the memory clear transistor;

wherein during a memory clear operation, assertion of the row select signal associated with any row occurs only when both the memory clear transistor and the previous row select transistor in the row decode circuitry associated with said any row are in their "on" state.

6. The memory array of claim 5 wherein the previous row select transistor in the row decode circuitry of any row is in its "on" state when the row select signal from a previous row in the memory array has been asserted.

7. The memory array of claim 6 wherein the memory array is a random access memory array (RAM).

8. The memory array of claim 5 wherein a gate of the previous row select transistor in the row decode circuitry associated with at least one row is connected to the main power supply to the memory array (Vdd) so that said at least one row is selected upon assertion of the memory clear signal.

9. The memory array of claim 5 wherein a gate of the previous row select transistor in the row decode circuitry associated with a first row of the plurality of rows is controlled by the row select signal of the row decode circuitry associated with a previous row of the plurality of rows.

* * * * *